United States Patent [19]

Suzuki et al.

[11] Patent Number: 5,139,963
[45] Date of Patent: Aug. 18, 1992

[54] METHOD AND A SYSTEM FOR ASSISTING MENDING OF A SEMICONDUCTOR INTEGRATED CIRCUIT, AND A WIRING STRUCTURE AND A WIRING METHOD SUITED FOR MENDING A SEMICONDUCTOR INTEGRATED CIRCUIT

[75] Inventors: Katsuyoshi Suzuki; Hachidai Nagase; Tetsuo Sasaki; Yousuke Nagao, all of Hadano, Japan

[73] Assignee: Hitachi, Ltd., Tokyo, Japan

[21] Appl. No.: 372,833

[22] Filed: Jun. 29, 1989

[30] Foreign Application Priority Data

Jul. 2, 1988 [JP] Japan .................. 63-165388
Aug. 10, 1988 [JP] Japan .................. 63-199360

[51] Int. Cl.$^5$ ............................ H01L 21/70
[52] U.S. Cl. ........................ 437/51; 437/8; 437/923; 364/490
[58] Field of Search ............ 437/8, 51, 923; 357/40, 357/41, 42; 364/488, 491, 490

[56] References Cited

U.S. PATENT DOCUMENTS

| | | | |
|---|---|---|---|
| 3,795,975 | 3/1974 | Cahoun et al. | 437/8 |
| 4,295,149 | 10/1981 | Balyoz et al. | 437/51 |
| 4,613,940 | 9/1986 | Shenton et al. | 364/490 |
| 4,691,434 | 9/1987 | Percival et al. | 437/51 |
| 4,720,470 | 1/1988 | Johnson | 437/51 |
| 4,829,014 | 5/1989 | Yerman | 437/51 |
| 4,882,690 | 11/1989 | Shinsha et al. | 364/488 |
| 4,920,497 | 4/1990 | Upadhyaya et al. | 364/491 |

FOREIGN PATENT DOCUMENTS 200500 11/1984 Japan .
229956 10/1987 Japan .
0298134 12/1987 Japan .

OTHER PUBLICATIONS

Case et al. "Solid Logic Design Automation" IBM Journal, Apr . 1964, pp. 127-140.
House "Development Systems Lays Basis For Fully Integrated VLSI Design Center" Electronics: Feb. 1980, pp. 143-147.

Primary Examiner—Tom Thomas
Attorney, Agent, or Firm—Antonelli, Terry, Stout & Kraus

[57] ABSTRACT

A method and a system for assisting mending of an LSI after it has been formed into a chip which is necessitated by modification of logic etc. The mending includes corrections by connecting or cutting interconnections of the LSI. The assisting method and system provides a method and a system for detecting which interconnection or connections should be subjected to mending according to the logic modification, or a method and a system for detecting an area or areas where the intended mending can be carried out, or a method and a system for advising a mending-allowable rate of the LSI. This invention further provides a wiring structure suited for mending of the LSI and a wiring method for the same. By this method, a wiring structure which preliminarily has a mending area in preparation for possible modification in logic is produced.

9 Claims, 14 Drawing Sheets

B – P    g 1  (addition)

C – P    j 1  (disconnection)

METHOD AND A SYSTEM FOR ASSISTING MENDING OF A SEMICONDUCTOR INTEGRATED CIRCUIT, AND A WIRING STRUCTURE AND A WIRING METHOD SUITED FOR MENDING A SEMICONDUCTOR INTEGRATED CIRCUIT

BACKGROUND OF THE INVENTION a. Field of the Invention

This invention relates to a method and a system for assisting mending of a semiconductor integrated circuit, such as a large-scale integrated circuit (hereinafter referred to as LSI), and more particularly to a method and a system for assisting mending of an LSI such as provision of new interconnections or cutting of existing interconnections which is necessitated, for example, by modification or change of the logic thereof. This invention further relates to a wiring formation or structure and a wiring method suited for mending the LSI. According to the present invention, interconnection routes to be mended are automatically located and the yield of the mended LSIs is improved.

b. Background Art

In recent years, logic information of LSI, indicative of logic interconnection relationships between circuit elements or cells and their signal line interconnections of the LSI, has become complex and complicated and enormous more and more as the integration of LSI has become higher. In fact, it is not easy to find out defects of logic in LSI and it is difficult to locate the portions to be mended at a designing stage of LSI. Besides, the logical defects may possibly be caused in the LSI manufacturing process. By this reason, the logical defects in LSI are usually found only after LSI has been packaged and tested. To remove such logical defects, it is preferable to redesign and remake the LSI, but this takes a considerable time, causing delay in production of the device.

Various attempts have been made to remove the logic defects of LSI, modifying its logic, within a short period of time, without redesigning it, even when defects in logic are found after incorporation of LSI into the device. In these attempts, defective portions of the LSI are mended by newly providing interconnecting lines or disconnecting the lines during the development of the device.

One of the earlier attempts is disclosed in Japanese Patent Laid-Open Publication (Kokai) No. 62(1987)-229956 which teaches a technique for employing ion beam or chemical vapor deposition (CVD) for connection or disconnection of LSI wiring.

Another earlier attempt is disclosed in Japanese Patent Laid-Open Publication (Kokai) NO. 62(1987)-298134, in which a spare wiring is provided in LSI in preparation for possible modification or change in interconnections between the elements to effect desired mending easily.

Further, Japanese Patent Laid-Open Publication (Kokai) No. 59(1989)-200500 discloses still another art which relates to a method for routing wiring paths between pin and pins on a wiring board with wiring pins.

When logic defects of an LSI are found, modification of the logic is made by investigating the logic information for logics on which the wiring of LSI is based, and then by correcting defective portions of the logic and rewriting the logic information. According to the so rewritten logic information, signal interconnections to be corrected are located for mending. The rewriting of the logic information is made for reconstructing the logic in view of the changed interconnection relationship between the logic to be corrected and other relevant logic and also for analyzing the operation of LSI after correction and providing correct logic interconnections for intended mass-production of the LSI.

The mending of LSI requires extremely precise operations. By this reason, the mending is generally carried out by an automatically controlled mending device. This mending device should be instructed correctly so that wrong signal interconnections should not erroneously be subjected to mending. However, it is not easy to exactly locate portions to be mended in the LSI according to the rewritten logic information and it may possibly happen that an operator will inadvertently input wrong data for the mending device. Thus, the mending operation requires much labor and time and it still involves every possibility of mis-instruction for locations to be mended.

The above-mentioned publications, however, fail to consider those problems and give no teaching to overcome them. Accordingly, it is a task to provide an assisting method for mending LSI correctly and easily.

In the mending of the interconnections of LSI, a special attention should be paid so as not to adversely affect other irrelevant interconnections. This attention should be taken particularly for LSI with high density, which is formed in multi-layer structure and fine microstrip wiring.

However, the publications as mentioned above do not contemplate any solution for those matters. Therefore, if the mending is carried out inadvertently, short-circuiting or disconnection of the other irrelevant lines may possibly be caused, creating another defect or misoperation.

A typical example of the prior art large-scale integrated circuit is as illustrated in FIG. 16. This integrated circuit has a multi-layer structure made up of three interconnecting pattern-formed layers AL1, AL2 and AL3 formed on an insulating substrate 65. As illustrated in FIG. 16(a), interconnecting patterns 64 and 66 provided on the uppermost layer AL3 are very close to each other and, therefore, it is likely to cut inadvertently part of the adjacent interconnecting pattern 64 when the interconnecting pattern 66 is cut. FIG. 16(b) illustrates another example, in which one of closely arranged interconnecting patterns 61 and 63, for example, interconnecting pattern 61 might be partly or totally cut when an interconnecting pattern 69 on the layer AL2 is cut at 62. Thus, there is a possibility of disconnection of irrelevant interconnecting patterns and it deteriorates the reliability of the mended LSI.

For forming a new interconnecting pattern to mend the LSI, it is necessary to partly expose a surface of an interconnecting pattern 72 to which the interconnecting pattern 70 is connected. In this operation, it may possibly happen that part of an adjacent interconnecting pattern 71 is also exposed inadvertently together with the interconnecting pattern 72. In this case, the interconnecting patterns 71 and 72 are short-circuited when the interconnecting pattern 70 is provided as illustrated in FIG. 16(c). In addition, there is a possibility of cutting part of the interconnecting pattern 68 of the uppermost layer AL3 when the interconnecting pattern 69 of the intermediate layer AL2 is partly exposed for connecting a new interconnecting pattern 60 to the pattern 69 as shown in FIG. 16(d). In this case, the interconnecting patterns 68 and 69 are short-circuited when the interconnecting pattern 60 is formed, and such short-circuiting causes malfunction.

Whereas, Japanese Patent Laid-Open Publication 62-229956 as recited above only discloses a mending method of an LSI, such as connecting or disconnecting of interconnection lines of the LSI, and fails to consider any adverse effect on the other interconnection lines causable by the mending operation. More particularly, the publication has no teaching about how to determine the position to be corrected without adverse affect on other irrelevant interconnections. This prior art, after all, requires expensive, high resolution ion beam generating equipment to effect the desired mending onto the LSI without causing adverse affect on the irrelevant interconnections. In addition, the mending operation requires microscopic processing such as connection or disconnection of the minute wiring and it requires much labor Furthermore, the mending operation becomes harder and the yield of the mended LSI is lowered as the wiring further becomes minute and integration of the LSI is increased.

The second publication or Japanese Patent Laid-Open Publication No. 62-298134 merely teaches provision of spare wiring to facilate repair or mending of the interconnections of the LSI and does not refer to the location of the disconnection or connection. This prior art also fails to suggest a solution for difficulty of the processing operation on the minute wiring of the LSI. Thus, this prior art also has such a problem that the yield of the mended LSI is still low.

The prior art as disclosed in the third publication or Japanese Patent Laid-Open Publication No. 59-200500 is directed not to LSI but to a wiring board This publication teaches how to determine a wiring path for the predetermined interconnection pins, but fails to disclose how to determine positions to be interconnected or disconnected In addition, this prior art is different, in both conditions and factors of determining wiring paths, from those required for the LSI and the disclosure of this prior art can not be applied to the LSI wiring technique.

In the mending of LSI, some areas or positions are difficult or quite impossible to be subjected to mending because of the positional relationships with the existing interconnecting lines or the density thereof. If information about such areas or positions is not given preliminarily, the mending operation shall be performed in a trial-and-error way, which is inefficient. If areas or position where the desired mending can be attained are known preliminarily, equivalent logic modification or change might be effected somewhere else. Thus, the mending operation can be carried out effectively without trying a useless operation. Even when some logical defects to be corrected are found in the LSI in the course of the development of the same and the LSI has no areas or positions which allow mending of the defects, redesigning of the LSI can be decided at once so as to promptly start remaking of the LSI, which takes a considerably long time.

However, none of the prior art as mentioned above suggest such preliminary clarification of the mending-allowable areas or positions of the LSI. Therefore, they can not provide high mending efficiency and prospect of mending chance.

SUMMARY OF THE INVENTION

It is a first object of the present invention to provide a method and a system for assisting mending of an LSI which is capable of detecting signal interconnections to be corrected or modified according to a modification or change in logic accurately and easily.

It is a second object of the present invention to provide a method and a system for assisting mending of an LSI which is capable of specifying areas or positions to be mended easily without causing any adverse affect on adjacent interconnections.

It is a third object of the present invention to provide a method and a system for assisting mending of an LSI which is capable of finding out mending-allowable areas or positions preliminarily to enable effective mending and proper and prompt decision of redesigning of the LSI when there is no mending-allowable areas or positions.

It is a fourth object of the present invention to provide a wiring formation or structure and a wiring method suited or adapted for possible correction of the LSI which is capable of improving the yield of the mended LSI.

It is a fifth object of the present invention to provide a wiring formation or structure and a wiring method suited for correction of the LSI which does not require a special, high-accurate mending machine for mending of the LSI, allowing the mending with lower positioning or mending accuracy, while ensuring the quality and yield of the mended LSI.

The present invention features a method for assisting mending of an LSI after it has been formed into a chip, the mending including correction of interconnections on the chip which is necessitated by modification or change of logic, which method comprises: as illustrated in FIG. 1, a step of modifying logic on data to be modified of logic information indicative of logic interconnection relationships of circuit elements and signal interconnections therebetween constituting the LSI; and a step of comparing the data of the modified logic with data of original logic to detect modification information for an interconnection to be corrected, based on a difference between the two data.

The present invention further features a method for assisting mending of an LSI, which method comprises: as illustrated in FIG. 2, a step of detecting modification information on a signal interconnection to be modified as the first method as described above, a step of detecting a position on the chip of the signal interconnection to be modified by referring to wiring information for routing the interconnections on the chip according to the logic information indicative of the logical interconnection relationship of the circuit elements and the interconnections therebetween; a step of detecting an area or areas where the desired modification is allowed, for the signal interconnection whose position on the chip has now been detected, by referring to a wiring rule prescribing conditions for allowing modification on the chip; and a step of outputting the results of the detection.

The present invention further features a method of assisting mending of an LSI after the LSI has been formed into a chip, the mending of the LSI including correction of signal interconnections on the chip so as to meet modification or change in logic, which method comprises: as illustrated in FIG. 3, a step of reading sequentially logic information indicative of logical inand wiring or routing method are applied to a logic LSI.

FIG. 13 is a diagrammatic view of part of a multi-layered LSI, illustrating one of the wiring layers thereof. This multi-layered LSI is provided with areas for logic circuit elements or cells such as logic gates, A to F. The cells have pins P11 to P17 for connection with other elements or cells.

The cells A to C have logic connection relationships with each other and are connected to each other through their respective pins P11 to P13. More specifically, the pin P11 is connected to the pin P12 through an interconnecting pattern 81, a through-hole T11, an interconnecting pattern 82, a through-hole T12 and an interconnecting pattern 83, and the pin P12 is interconnected to the pin P13 through an interconnecting pattern 83, a through-hole T12, an interconnecting pattern 84, a through-hole T13 and an interconnecting pattern 85.

Similarly, cells D, E and F are in a logic connection relationship with each other through the pins P14: the pin P14 is connected to the pin P15 through an interconnecting pattern 86, a through-hole T14, an interconnecting pattern 87, a through-hole T15 and an interconnecting pattern 89, and the pin P15 is interconnected to the pin P16 via an interconnecting pattern 89, a through-hole T15, an interconnecting pattern 90, a through-hole T16, an interconnecting pattern 91, a through-hole T17, an interconnecting pattern 92, a through-hole T18, an interconnecting pattern 93, a through-hole T19, an interconnecting pattern 94, a throughhole T20 and an interconnecting pattern 95.

In the wiring formation as illustrated, a mending area 903 is provided between through-holes T11 and T12 and between through-holes T14 and T15, and another mending area 904 is provided between through-holes T12 and T13 and between through-holes T15 and T20. In this case, the through-holes T12 and T15 constitute branch points of the wiring pattern. If possible, a pin-to-branch point mending area is preferably provided between the pin P12 and the through-hole T12 and between the pin P15 and the throughhole 12.

For the mending area 903, the interconnecting pattern 87, which extends between the through-hole T14 and T15, has a dog-legged portion or roundabout way 88 which extends away from a straight line between the through-holes for enlarging the spacing from the adjacent interconnecting pattern 82. The enlarged spacing is formed so that the adjacent interconnecting patterns be obstacles to the intended mending operations such as breaking or additional providing of interconnecting patterns. Of course, the spacing required for the mending operation depends on the machining or processing precision of a mending means employed.

With respect to the mending area 904, a roundabout way 96 be provided for the interconnecting pattern between the through-holes T15 and T20. This roundabout way 96 is formed of the interconnecting patterns 91 to 93. Being different from the roundabout way 88, the roundabout portion 96 is formed using another wiring layer through the through-holes T16-T19. The interconnecting patterns 91 to 93 are not necessarily formed in the same layer. At least the interconnecting pattern 92 is preferably provided in an upper layer than the layer illustrated in FIG. 13. As can be seen from FIG. 16, interconnecting patterns of any two adjacent layers generally run perpendicularly with each other, and channels between any two adjacent interconnecting patterns on the respective layers run in the same direction as that of the interconnecting patterns of the respective layers. More particularly, if it is assumed that the layer shown in FIG. 13 is the layer AL1, the interconnecting patterns 91 and 93 may be provided on the intermediate layer AL2 and the interconnecting pattern 92 may be formed on the uppermost layer AL3.

If the interconnecting patterns of the roundabout portion are formed on the same layer as in the mending area 903, the total number of the through-holes necessary for interconnection can be reduced. Whereas, the number of the through-holes is increased if the interconnecting patterns of the roundabout portion are formed in an upper layer or layers layer as in the mending area 904. The latter is advantageous in that the mending operations can be carried out on the upper layer when an interconnecting pattern, for example, a pattern between the pins P15 and P17 is to be mended. In this connection, it is to be noted that if the roundabout portion 96 is formed in the uppermost layer, there is no need to consider other interconnecting patterns of a further upper layer, which should otherwise be considered, for cutting the interconnecting pattern of the roundabout portion as in the embodiment illustrated. In addition, this arrangement has another advantage that the cutting of the interconnecting pattern may be shallow, which can facilitate the processing and prevent possible damage otherwise causable by deep cutting.

Assuming that the logic is to be modified so that pin P12 of the cell B be connected to the pin P17 of the cell F instead of the pin P13 of the cell C in the formation of FIG. 13, the interconnecting pattern 84 is cut at a position X in the mending area 904 by a conventional means such as laser or an ion beam. In this event, possible damage or injury to the interconnecting patterns adjacent to the interconnecting pattern 84, is prevented since the latter is sufficiently spaced from the former. Thereafter, the pin P12 of the interconnecting pattern 84, which has now been cut, is connected to the pin P17 by means of wiring 100. The wiring is just diagrammatically illustrated in the form of a discrete wire in the figure.

FIG. 14 illustrates a vertical section of a mending area of an LSI structure according to the present invention for comparison with that of the prior art LSI structure illustrated in FIG. 16.

In FIG. 14(a), two adjacent interconnecting patterns 64 and 66 on the uppermost layer AL3 has an increased spacing as compared with the patterns shown in FIG. 16(a). With this formation, it is enabled to accurately cut only the interconnecting pattern 66 without requiring high machining or processing precision.

In the case of FIG. 14(b), since the interconnecting pattern 61 is spaced by a predetermined distance or more from the adjacent interconnecting pattern 63 on the same layer AL3, the interconnecting patterns 61 and 63 on the upper layer are not damaged or injured when the interconnecting pattern on the lower layer is cut.

With the formation illustrated in FIG. 14(c), the interconnecting patterns 71 and 72 are spaced by a sufficient distance as compared with those in FIG. 16(c), so that possible short-circuiting between them by a newly provided interconnecting pattern 70 can be avoided to a great extent. Similarly, in the case in FIG. 14(d), the adjacent interconnecting patterns 67 and 68 are sufficiently spaced as compared with the corresponding patterns in FIG. 16(d). As a result of this, the possibility of short-circuiting between the adjacent interconnectmending-allowable area data may additionally or alternatively be supplied to the mending means 110 to allow automatical mending thereby with or without such display The mending-allowable area data may be stored in the storage means 10.

It is preferable to specifically assign positions to be mended in the case the data is supplied to the mending means 110. As can be understood from the foregoing description, the detected mending-allowable area data usually contain a plurality of mending-allowable areas. In other words, the detection results do not determine area to be actually processed to attain the desired mending definitely. Therefore, if the detection results are supplied as they are to the mending means 110, the mending means 110 should specify the location to be subjected to the mending. In order to attain the mending automatically, it is preferable to specify the location to be mended before the data is supplied to the mending means 110.

When there are a plurality of mending-allowable areas for the desired mending of the interconnection, an area where the mending is attained is made is first selected from the plural candidates and then a specified position is chosen within the selected area In this operation, it is at the option which area is to be selected and which position in the selected area is to be determined.

In the present embodiment, however, the position to be mended is determined according to the priority. More specifically, the position to be mended which is on the uppermost layer of the chip has the highest priority. Now, assuming that line segments L1, L2, L4 and L5 shown in FIG. 8 are mendable, the line segment L4 is selected according to the rule that the line segment of the uppermost layer has the top priority.

If the line segment L4 thus selected has two mending-allowable areas 901 and 902 as illustrated in FIG. 9, they are further subjected to other priority conditions: the length of the interconnection can be shorter; interference with other mending operation can be avoided; the delay value can be within an appropriate range. These conditions may be applied, for example, to the areas 901 and 902. When one of the areas has the priority over the other, then said one is selected.

Thus, the data indicative of the position to be mended is outputted to the mending means to enable automatic mending of the interconnections.

A third embodiment of the present invention will now be described with reference to FIGS. 3 and 6, in which all the modification information data for the interconnections of the LSI are detected and the data are utilized to detect the mending-allowable positions.

As illustrated in FIG. 6, a mending-assisting system of this embodiment has substantially the same elements as that of the second embodiment except that this embodiment does not comprise the modified logic information master file 12, the mending-required interconnection information file 13, the logic modifying means 20 and the mending-required signal-interconnection detecting means 30. Thus, description of each element is omitted here.

According to this embodiment, CPU 101 sequentially reads original logic information data from the original logic information master file 11 (step 301), and then detects a specific position on a chip for each signal interconnection, while referring to the logic information data as in the step 203 of the second embodiment (step 302).

Subsequently, CPU 101 applies the wiring rules to each signal interconnection whose position has been detected to determine a mending-allowable area or areas as in the step 204 of the second embodiment (step 303).

The so obtained mending-allowable area or areas is or are outputted by the output device such as the CRT display 104, the printer 107 (step 304). The output data may be stored in the storage means 10.

Although all the data for the mending-allowable area or areas are outputted in the third embodiment, the data may be selected for outputting and only the data for the specific position determined to be mended may be outputted as in the second embodiment. In this case, the priority conditions adopted in the second embodiment are preferably applied to the operation of specification of the positions to be mended.

The third embodiment may additionally have a further function to obtain a mending-allowable rate.

This mending-allowable rate is obtained in such a manner that the number of the pin-to-pin signal interconnections between the respective circuit elements are counted when the logic information is read from the original logic information master file 11 in the step 301 of the third embodiment and the number of the signal interconnections having the mending-allowable area or areas detected by the operation of detection for the mending-allowable area or areas in the step 303, and the latter number is divided by the former number.

For obtaining the rate, a counter (not shown) may be provided inside or outside of CPU 101. The counter counts the latter number whenever the data are read and the former number upon every detection of the signal interconnection with a mending-allowable area or areas. After completion of the data reading, the rate is obtained by carrying out the division, using the counted numbers.

Counters may be provided for the kinds of mending operations, respectively. With these counters, the mending-allowable rate can be obtained according to the kinds of the mending operations. For example, the rate may be obtained in the form of a rate for new provision of interconnections or a rate for breaking of interconnections.

Although only the mending-allowable areas are detected in the second embodiment, mending-prohibited areas may also be detected and outputted. Similarly, mending-prohibited area or areas may also be detected in the third embodiment. Or, only the mending-prohibited area or areas may be detected instead of the mending-allowable area or areas. When there are both the mending-allowable areas and mending-prohibited areas for the same kind of mending operation, it is convenient to separately detect.

In the foregoing embodiments, mending-allowable areas, for example, areas in which there are sufficient spacing, i.e, spacing larger than the predetermined distance from the adjacent interconnections are detected and the locations to be subjected to the desired mending are specified. However, it would be preferable to previously provide mending-allowable area or areas for each interconnection for facilitating mending operations and for improving the yield of mended integrated circuit.

FIGS. 13 to 15 illustrate embodiments of the present invention in which a mending-allowable area or areas is or are previously provided for each interconnection. In this embodiment, a wiring formation or configuration such that interconnections may or may not intersect other interconnections. More specifically, they contain at least the conditions for allowing provision of new intersections or disconnection of the interconnections already provided so as to prevent undesired injury or short-circuiting of or between the adjacent interconnection during the mending operation, such as providing new interconnections or opening holes for interconnecting different layers or breaking the interconnections.

Each of the means and files of the second embodiment may be formed of the hardwares of FIG. 12 as in the first embodiment. Only the components not included in the first embodiment will be described here.

The mending location detecting means 40 comprises CPU 101, ROM 102, RAM 103, keyboard 105 and storage unit 106. The output means 50 is composed of the CRT display means 104, printer 107 and mending means 110.

Referring now to FIG. 2, a way to apply the mending-assisting method of the second embodiment will be described. Prior to starting the mending-assisting method, the wiring information file 15 and the wiring rule library 14 are first prepared. Thereafter, modification information concerning signal interconnections to be mended is detected and stored in the mending-required signal-interconnection information file 13 in a manner similar to that in the first embodiment (step 201). The detected modification information data concerning signal interconnections to be mended are sequentially read out (step 202), and then a specific location on a chip is determined, for each of the modification information data, referring to interconnection information in the wiring information file 15 (step 203).

When referred to the interconnection information, it can be known that a particular signal interconnection to be mended, for example, B-P is so arranged that circuit elements d, e and f are interconnected to each other as shown in a plan in the block 1001 of FIG. 10 or as in a vertical section in FIG. 8. In this arrangement, an AL1 layer, an AL2 layer and an AL3 layer are formed on a substrate for wiring. The circuit elements d, e and f are provided on the AL1 layer and are interconnected to each other through line segments L1 and L5 of the AL1 layer, a line segment L2 of the A12 layer, a line segment L4 of the A13 Layer, and through-holes T1, T2, T3 and T4.

Although the arrangement is given in the form of wiring diagrams in these figures for the sake of illustration, the information is actually given as a list of three-dimensional coordinates on the chip of the positions of the circuit elements, ends of the line segments constituting the respective interconnections, the layers in which the wirings are made, and the positions of the through-holes to be used.

Then, the wiring rules are applied to each signal interconnections of which the positions have been read as mentioned above to detect locations where the desired mending can be attained (step 204). The application of the wiring rules is made for each of the line segments constituting the respective signal interconnection. More particularly, it is checked, by referring to the wiring rule, if there are interconnections adjacent to each of the line segments constituting the interconnections at a distance smaller than that required by the wiring rule on the same layer, or if there is an interconnection on a lower layer just beneath the segment. Thus, areas where no adjacent interconnections exist which are prohibited by the wiring rules are determined.

More specifically, the line segment L4 of the signal interconnection B-P to be mended is adjacent to signal interconnections D-P and E-P in the embodiment as illustrated in FIG. 9, and hence it is checked whether the spacings thereof from the signal interconnections D-P and E-P has a length required for allowing the mending or longer. The signal interconnections D-P and E-P consist of line segments L1-L7 and line segments L1-L9, respectively. From data of the wiring information file 15, CPU 101 detects line segments of the signal interconnections D-P and E-P which are parallel to the line segment L4 of the signal interconnection B-P. The spacings of the line segment L4 of the signal interconnection B-P from the so detected line segments, respectively, are determined by using their coordinate data. The thus detected spacings are then compared with the spacings prescribed in the wiring rules.

Now, if it is assumed that areas defined between signal interconnections D-P and E-P at their respective line segments L3 and L7, meet and satisfy the wiring rules, CPU 101 finds them out by their coordinates. Thus, areas 901 and 902 in FIG. 9 are determined as mending-allowable areas.

Other wiring rules are also applied, depending upon the kind or nature of the mending operation. When it is required to open a hole, the rule should include such conditions that other signal interconnections are not present on the adjacent underlying layer just beneath the hole to be opened. Or, when it is necessitated to newly provide a signal interconnection on the same layer, the wiring rule requires that the new signal interconnection can extend to a destination or a desired position.

With respect to the former conditions, the line segment L3 lies under the line segment L4 of the signal interconnection B-P, but the segment L3 is not on the layer AL2 adjacent to the layer AL3, but on the lowermost layer AL1 as shown in FIG. 8 line. Thus, the line segment L4 of the signal interconnection B-P meets the former conditions. Accordingly, the area 901 can still be a mending-allowable area. However, if the wiring rule prescribes that other interconnections should not be present in the lowermost layer either, then the area 901 becomes a mending-prohibited area.

With respect to the latter conditions, a new interconnection cannot extend to the destination on the same layer at the area 901, but it may extend at least to a right pin P8 of the line segment L4 of the signal interconnection B-P since a segment L7 of the signal interconnection D-P extends to that pin, keeping a widened spacing from the segment L4 of the interconnection B-P. In this case, the line segment L4 is allowed to be mended only at the area 902.

When wiring rules are applied, reference is made to the wiring information to know positions of other interconnections etc. as described above. For this reason, when the position of a signal interconnection is detected, the data for the positions of the interconnections existing around said signal interconnection is preferably stored in RAM together with the data for the position of the signal interconnection.

The CPU 101 outputs the obtained mending-allowable area data for each of the signal interconnections by means of the output device, such as the CRT display 104 and the printer 107 (step 205). At this time, the storage means 10 comprising RAM 103 in the embodiments of the present invention.

In the first embodiment, conditions of priorities and delay values are provided in a wiring rule library in the storage means 10.

Each of the logic modifying or changing means 20 and the mending-required signal-interconnection detecting means 30 comprises CPU 101, RAM 103, the keyboard 105 and the storage unit 106. The mending-requiring signal-interconnection detecting means 20 may be connected to outputting devices, such as the CRT display means 104 and the printer 107.

Referring to FIG. 7, the mending-assisting method of this embodiment will now be described.

First, the original logic information master file 11 for an LSI to be mended is prepared. This master file contains logic information indicative of logic interconnection relationships and composed of circuit elements such as cells of an LSI and their signal interconnections. According to the present embodiment, a file which was made during the logic designing of the LSI may preferably be used as the original logic information master file 11. The file 11 is provided or stored in the storing unit 106, which comprises the storage means 10 (step 701).

The logic information is actually very complex and complicated, but it may be explained such that the wiring of a logic circuit as diagrammatically illustrated by a block 1001 in FIG. 10 is given in a specific format. For example, this wiring may be expressed by equations as illustrated in a block 1101 of FIG. 11(a). These expressions show the interconnection relationships of signal interconnections A-P, B-P and C-P with respective interconnecting pins (indicated by numerals) by circuit elements a, b, c ... Thus, the logic information is given, corresponding to pins of the circuit elements in the embodiment as illustrated. This is for easiness of designers' operation.

Then, CPU 101 copies the logic information data stored in the original logic information master file 11 and stores the same in the storage unit 106 in preparation for a modified logic information master file 12 (step 702). The logic information copied and stored for the modified logic information file 12 is then subjected to modification or change on portions to be mended (step 703) and the modified logic information is stored in the modified logic information master file 12 (step 704).

The modification or change of the logic information is made by rewriting the equations representing the logic information as referred to above, with the keyboard 105. If it is assumed that modification or change of the logic is to be made so that an element or cell j is disconnected from a signal interconnection C-P at 1003, while an element or cell g being connected to a signal interconnection B-P at 1004 as indicated in a block 1002 of FIG. 10, equations is rewritten as shown in FIG. 11 (b). More specifically, addition and change of the logic information are made as follows:

| g | 1 = B − P | addition |
|---|-----------|----------|
| j | 1 = O | disconnection |

In addition to the modification of the equations, a kind or nature of the mending is also described. Although the description of the kind of the mending is described in English in the embodiment as illustrated, it may be described in other languages or in signs or numerals. The description of the kind of mending may be used not only for a message but also for a command to CPU 101.

The modification or change of the logic information shown in FIG. 1 is carried out as mentioned above, and the detection of signal interconnections to be mended also shown in FIG. 1 will now be described.

CPU 101 sequentially reads logic information data from both the original logic information master file 11 and the modified logic information master file 12 (step 705) and compares them to check whether there is any difference between the two data or not (step 706). If there is no difference between them, then it is checked whether there remains any data of the logic information to be compared (step 710). If there remains data, procedures are repeated from step 705.

If there is a difference between the data from the file 11 and the data from the file 12, CPU 101 detects the difference as a modified information (step 707) and stores it in the mending-required signal-interconnection file 13 (step 708). Then, the modification information data are sorted to be arranged in a format according to the signal interconnections as shown in FIG. 11(b) (step 709). The steps 705 to 709 are repeated until all the logic information data has been compared (step 710).

In this embodiment, the logic information master file prepared during the logic designing of LSI may advantageously be utilized to automatically and easily obtain accurate modification information of the signal interconnections to be amended which is caused by logic change or modification only by introducing the logical change or modification into a copy of the logic information master file.

A second embodiment of the present invention will now be described. In this embodiment, not only the modification information concerning signal interconnections to be mended is detected, but also areas or points where the desired mending is attained are detected by utilizing the modification information.

A system employable in the second embodiment is illustrated in FIG. 5. This system has a wiring rule library 14 and wiring information file 15 which are provided in the storage means 10. The wiring rule library 14 contains conditions for allowing mending processing of a chip as wiring rules. The wiring information file 15 stores routing or interconnection information for laying out interconnections on a chip according to the logic information stored in the original logic information master file 11. The system further includes a mending location detecting means 40 and an output means 50 connected to the detecting means 40. The mending location detecting means 40 detects areas or points for the signal interconnections to be subjected to mending, where the desired mending can be attained, referring to the interconnection information and the wiring rules. The output means 50 outputs results of the detection by the mending location detecting means 40.

The wiring information file 15 designates each of the interconnections between the circuit elements in the form of coordinates indicative of grid on a chip to physically provide the interconnections on the chip.

The wiring rule library 14 defines various conditions for allowing mendings on a chip. The conditions include conditions for allowing the interconnections formed on the chip to maintain their required characteristics or prohibitive or allowable conditions due to technical restrictions in wiring. For example, the conditions are such that the spacing between the adjacent interconnections should be a predetermined value or more or forming of new interconnections are effected within the areas. Since a sufficient space is provided in the mending-allowable areas, inadvertent affect on the adjacent interconnections during the mending operation such as cutting of the interconnections, can be prevented even with ordinary or relatively low machining precision. In forming of new interconnections, short-circuiting of adjacent interconnections due to relatively low positioning and machining precision can also be avoided in the mending-allowable areas.

Preferably, the mending area is provided to any pin-to-pin area, pin-to-branch point are, or branch point-to branch point area. In this case, the LSI can be mended so as to cope with any logic modification. The term "branch point" is used herein to mean a point where at least three interconnecting patterns join.

Highly reliable mending of an LSI is made even when a mending machine with high positioning and machining precision is not used. However, a machine having such high positioning and machining precision may also be employed in the present invention, although the yield of mended LSI can be improved without any high precision mending machine. Such a high precision machine would enable processing or mending of more minute, complicated LSI.

In the present invention, such conventional methods as disclosed in Japanese Patent Laid-Open Publication Nos. 62-229956 and 62-298134 previously discussed, may be used for connection or cutting of the interconnecting patterns.

DESCRIPTION OF PREFERRED EMBODIMENTS

This invention will now be described by way of example with reference to the accompanying drawings.

Figure 1:
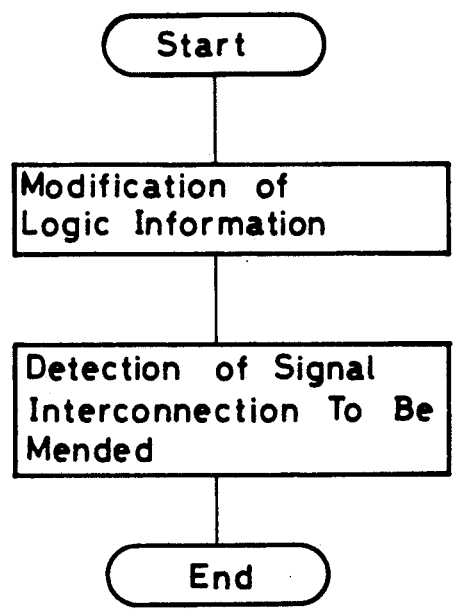
FIGS. 1 to 3 are flow charts of the first to the third embodiments of the present invention, illustrating an LSI mending-assisting method, respectively.
Figure 2:
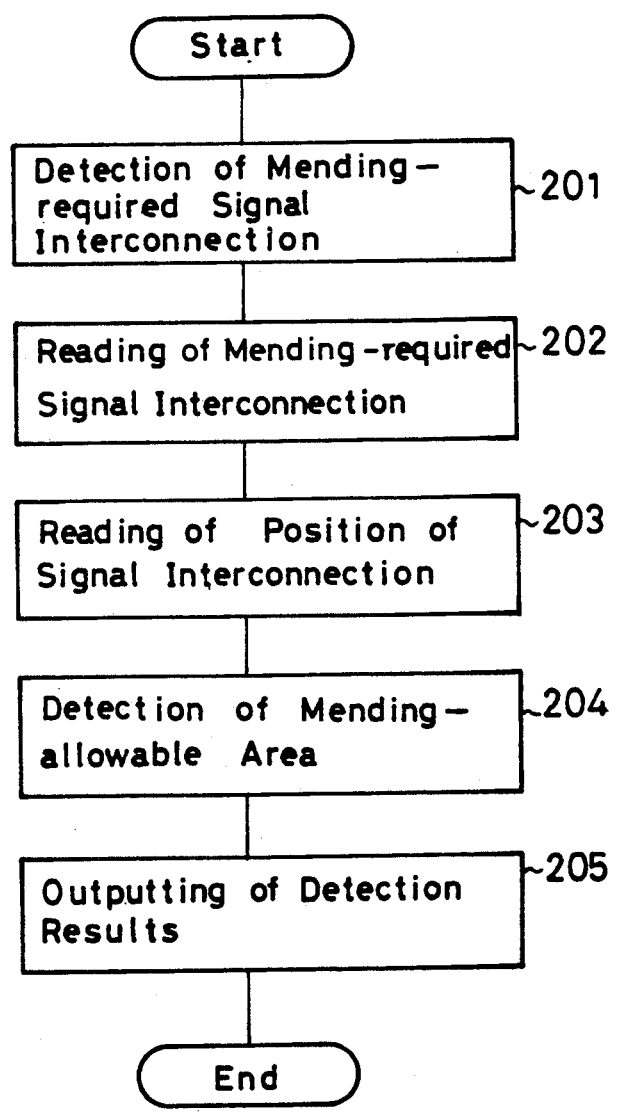
Figure 3:
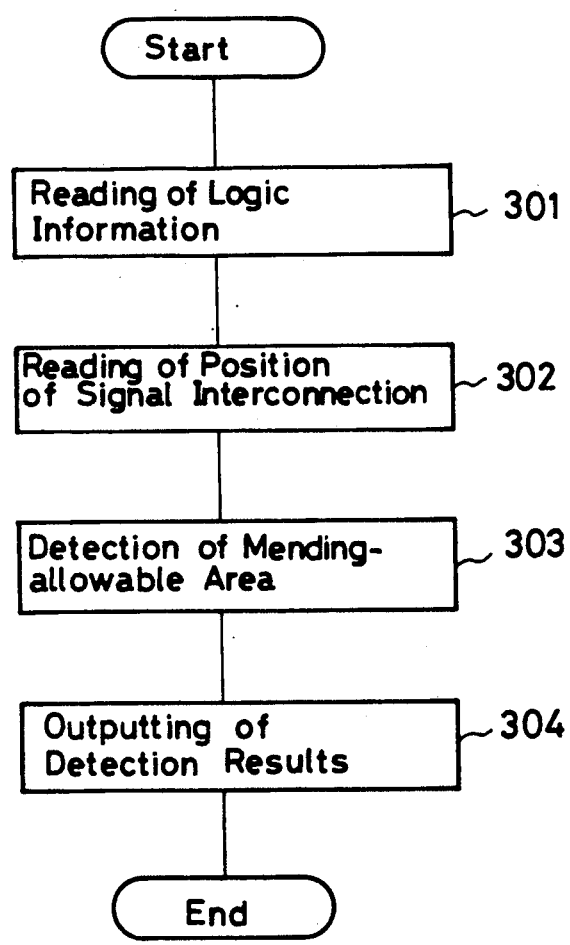
Figure 4:
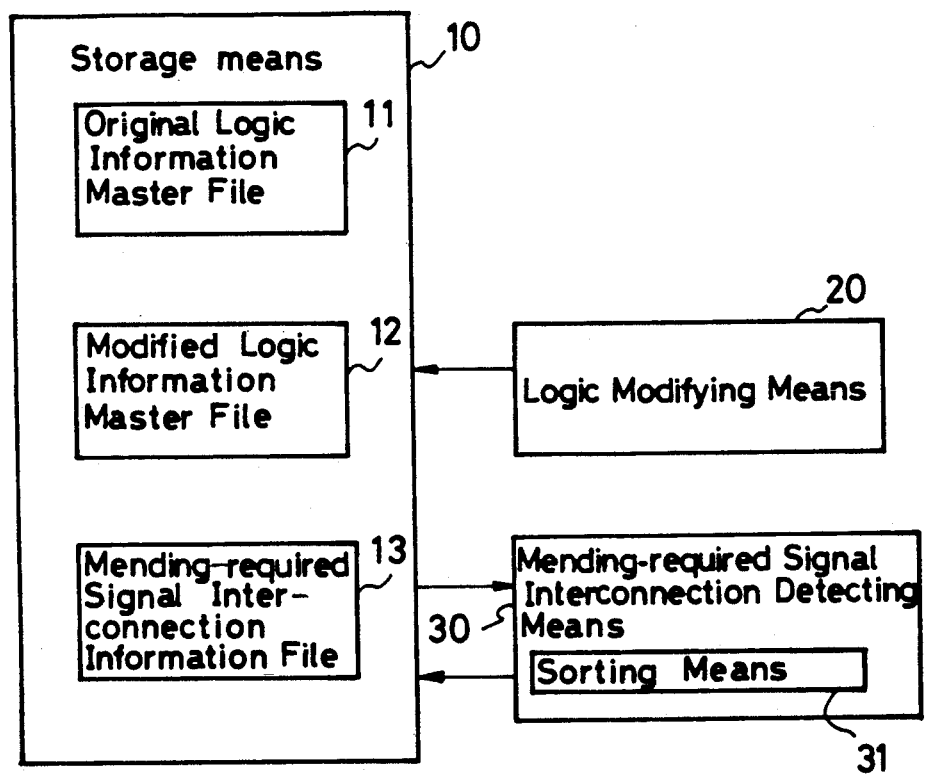
FIGS. 4 to 6 are block diagrams showing the first to the third embodiments of the LSI mending-assisting system of the present invention, respectively.
Figure 7:
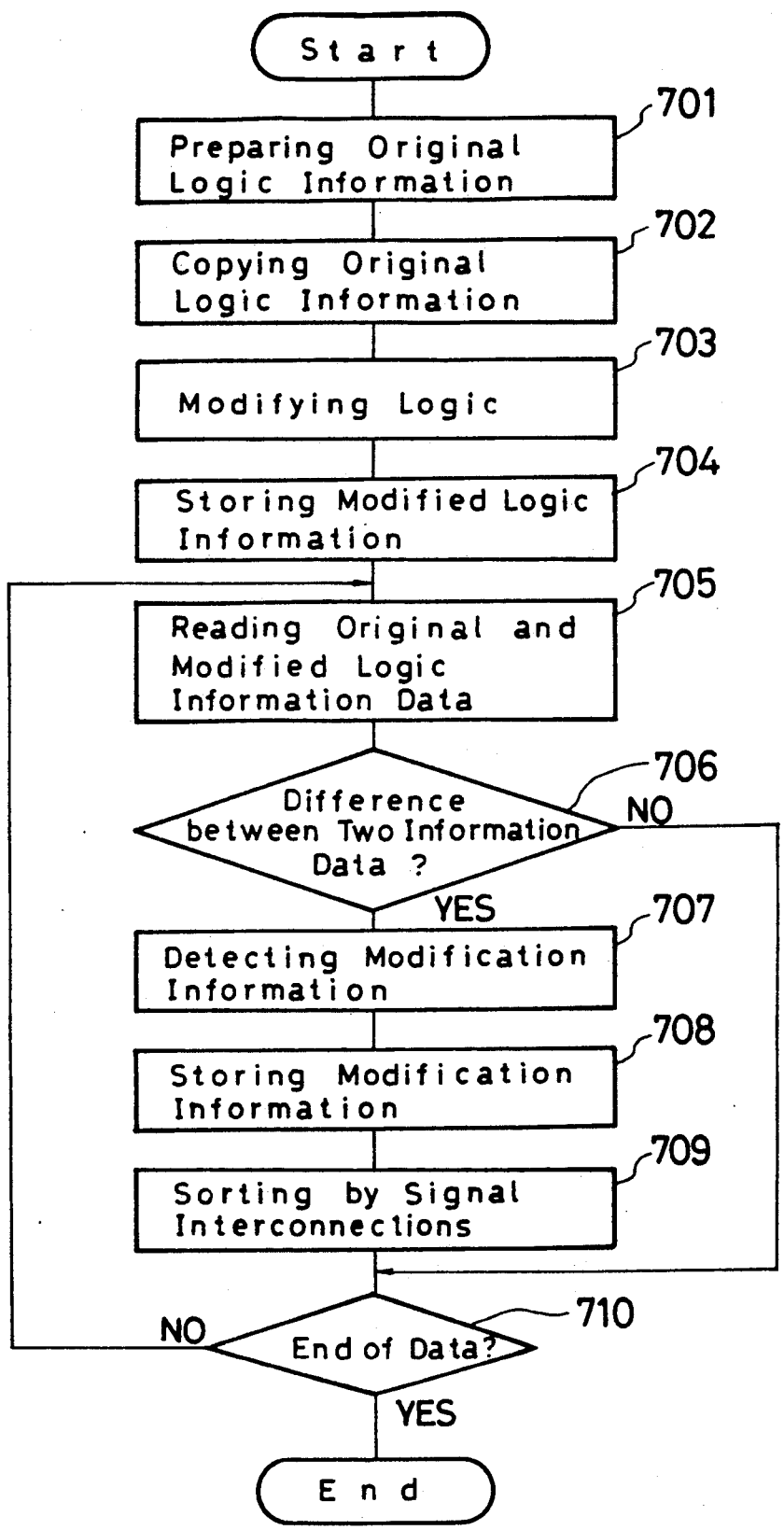
FIG. 7 is a flow chart illustrating in a more detailed manner the first embodiment of the assisting method shown in FIG. 1.
Figure 8:
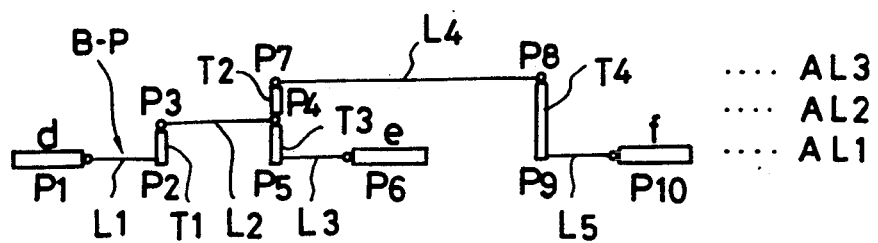
FIG. 8 is a diagrammatic illustration of a vertical wiring structure in a multi-layered LSI to which the present invention is applied.
Figure 9:
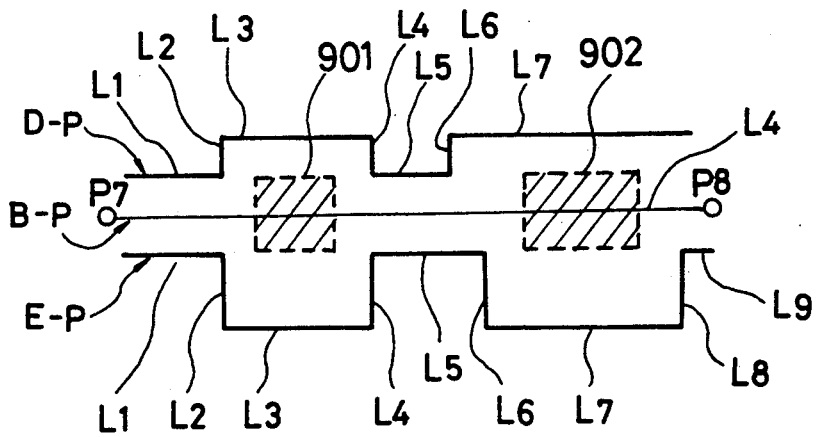
FIG. 9 is a diagrammatic illustration of the uppermost layer of the wiring structure of the LSI shown in FIG. 8.
Figure 10:
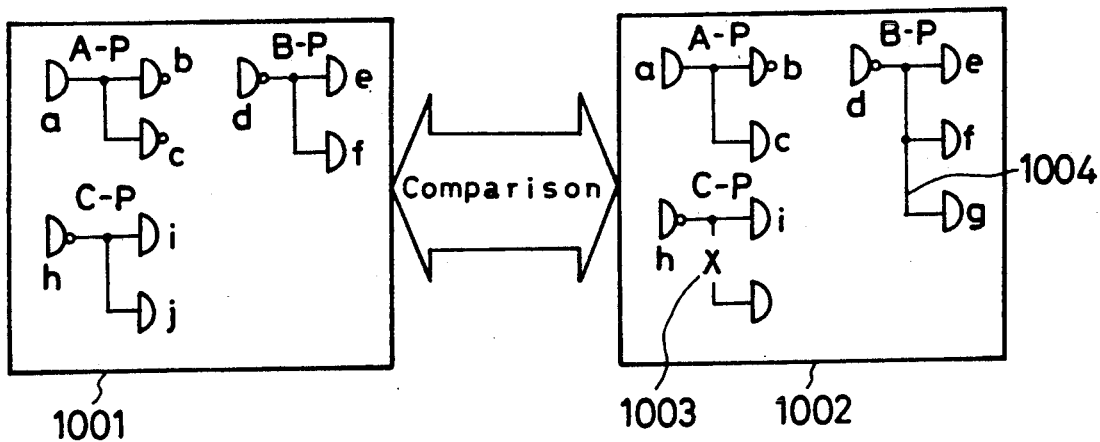
FIG. 10 is a wiring diagram showing the logic interconnection relationship between circuit elements and signal interconnections shown in FIG. 8.
Figures 11A, 11B:
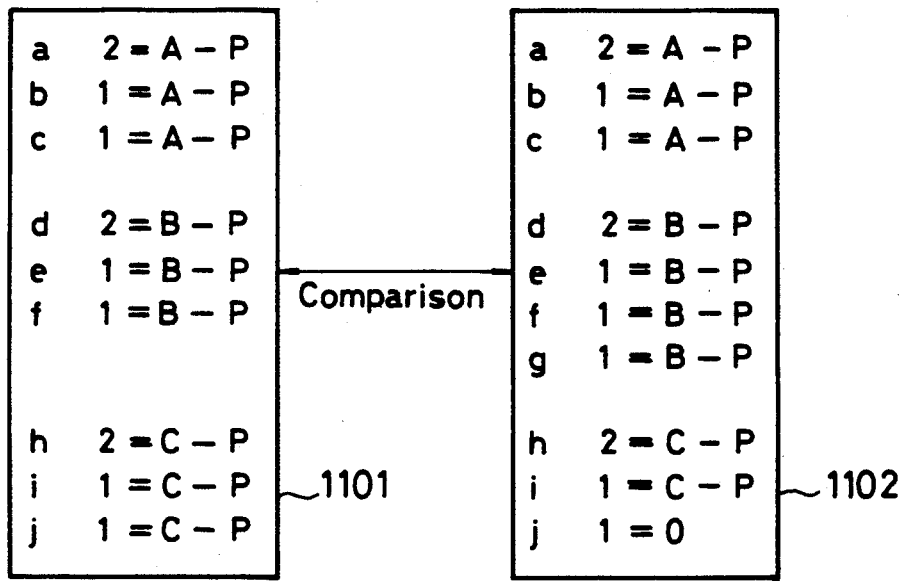
FIG. 11(a) and (b) are illustrations in which the logic interconnection relationship is expressed by equations.

FIG. 7 is a flow chart of a mending-assisting method according to a first embodiment of the present invention and FIG. 4 illustrates, in the form of a block diagram, a system for carrying out the mending-assisting method according to the embodiment.

This first embodiment is directed to detection of modification information indicative of signal wirings or interconnections to be subjected to modification or mending to provide such signal wirings or interconnections to be modified or mended exactly and easily. Thus, the embodiment will assist the desired mending of LSI. The modification information may also be used for finding or locating areas or points where the desired mending can be done, as will be described later in connection with the subsequent embodiment.

As illustrated in FIG. 4, the system comprises a storage means 10 which includes an original logic information master file 11, a modified logic information master file 12 and a mending-required signal interconnection file 13. The original logic information master file 11 stores logic information indicative of logic interconnection relationships and made up of circuit elements such as cells and wirings interconnecting therebetween which constitutes an LSI. The modified logic information master file 12 stores logic information after modification. The system further comprises a logic modifying or changing means 20 and a mending-required signal-interconnection detecting means 30 with a sorting means 31. The logic modifying or changing means 20 reads the original logic information stored in the original logic information master file 12, modifies or changes the logic of data portions in the read original logic information which is to be subjected to modification or change and then writes the so modified or changed logic information in the modified logic information file 12. The mending-required signal-interconnection detecting means 30 detects modification information regarding signal interconnections to be subjected to mending by comparing logic information data of the original logic information master file 11 and those of the modified logic information master file 12.

Figure 12:
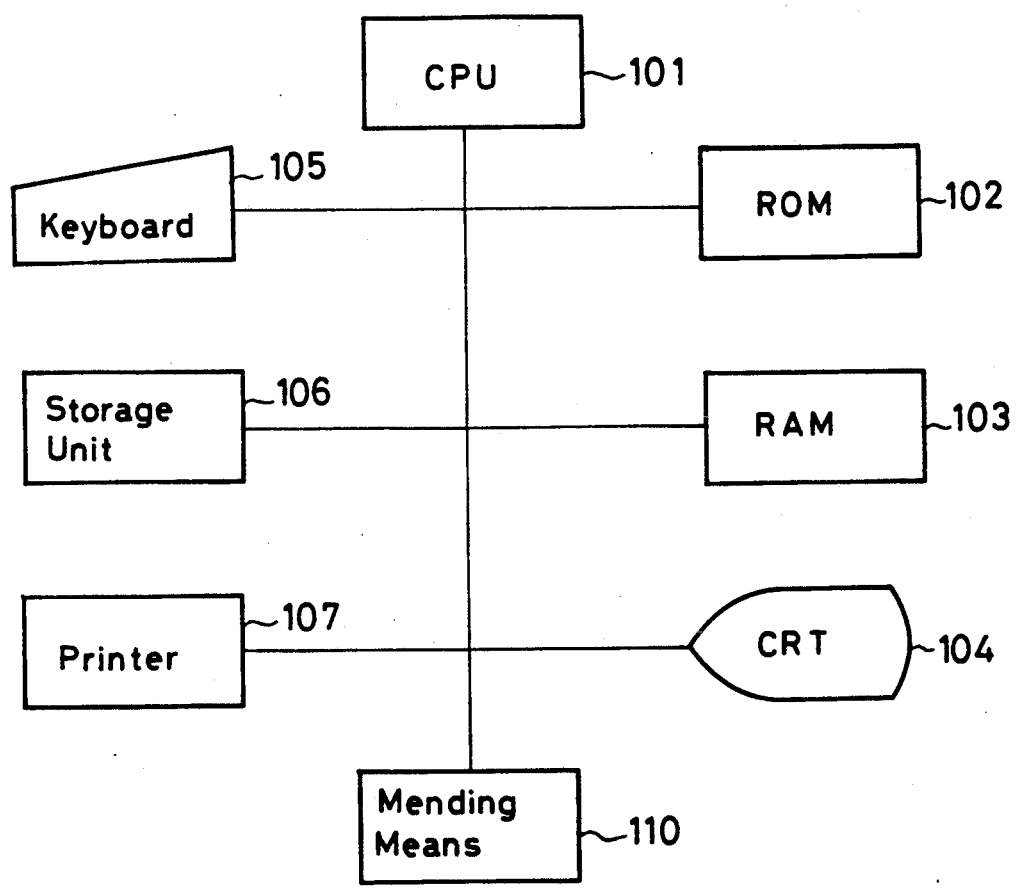
FIG. 12 is a block diagram of hardwares used in each embodiment of the present invention.

These means as mentioned above may be provided in the form of hardwares shown in FIG. 12.

More specifically, the system includes: a central processing unit or CPU 101 for controlling the entire system and effecting comparison and operation; a read only memory or ROM 102 which stores a program for controlling CPU 101; a random access memory or RAM 103 which is used as a working area of CPU 101; a cathode ray tube (CRT) display means 104 for displaying results of processing; a keyboard 105 for inputting data or commands; a storage unit 106, such as a magnetic disc storage means; and a printer 107 for printing out the results of processing. The system further comprises a mending means 110 connected to CPU 101 for automatically carrying out the desired mending according to the modification information.

The storage means 10 of this embodiment comprises the storing unit 106. For storing temporary data, RAM 103 may be used as part of the storing means 10. More particularly, it is preferable to use RAM 103 for the mending-required signal-interconnection information file 13. For this reason, the file 13 is provided in the semiconductor integrated circuit suited for mending of the interconnecting patterns after the circuit is formed in a chip, according to modification of a logic, which method comprises: a step of wiring the interconnecting patterns without considering a spacing between two adjacent interconnecting patterns; a step of checking whether there is an area associated with each of the interconnecting patterns which may undergo the mending and having a spacing of a predetermined distance or more from an adjacent interconnecting pattern; a step of changing the route of the interconnecting pattern when the checking result is negative for providing a roundabout portion having a spacing of said predetermined distance or more.

A still another mode of the present invention is directed to a method for wiring interconnecting patterns of a semiconductor integrated circuit suited for mending of the interconnecting patterns after the circuit is formed in a chip, according to modification of a logic, which method comprises the steps of: (a) writing the interconnecting patterns without considering the spacing between two adjacent interconnecting patterns; (b) registering interconnecting patterns which may undergo the mending; (c) searching for a interconnecting pattern adjacent to each registered interconnecting pattern; (d) checking whether there is an area associated with one of the registered interconnecting patterns and having a spacing of a predetermined distance or more from an adjacent interconnecting pattern; (e) when the checking result is affirmative, registering the area as a mending area; (f) when the checking result is negative, changing a route of the interconnecting pattern to another for providing a roundabout portion having a spacing of the predetermined distance or more; (g) registering said another route as a mending area; (h) repeating the steps (c) to (g) for all the remaining registered interconnecting patterns.

The checking of the area in the step (d) may be carried out by a unit length from one end of each interconnecting pattern toward the other end thereof.

After the step (e) and (g) and/or the step (h), each area registered as the mending area may be outputted through outputting means. A list of the correction area may be indicated, for example, by a display device or a printer, or the mending area may be graphically displayed by a graphic display device or an X-Y plotter.

The interconnecting pattern adjacent to each interconnection pattern to be checked in the checking step is not limited to the interconnecting patterns on the same layer. The interconnecting patterns on an upper layer are also to be subjected to the checking. In the latter case, the adjacent interconnection pattern in the upper layer is projected onto the same layer for consideration.

The roundabout portion is preferably formed on the same layer as the remaining portion of the adjacent interconnecting layer or on a layer upper than the layer in which the remaining portion is arranged. The term "wiring" used here does not mean physical wiring of a conductor on an actual LSI, but routing or laying-out of interconnecting patterns on the LSI.

According to the present invention, modification of logic is made for data to be modified of the logic information which indicates logic interconnection relationships of circuit element groups and signal interconnections therebetween constituting the LSI. The original data and the modified data are compared to detect a difference between them for detecting modified information data concerning signal interconnections to be mended.

In this processing, only the step of modification of the logic is manually carried out. The modification of the logic is described in a predetermined format and can be executed with ease in a relatively short time. Comparison of both data may be carried out by a computer having a central processing unit or CPU as a main unit and the detected results can easily and promptly be obtained.

In connection with the detected modified information data concerning signal interconnections to be modified, specific positions in the LSI chip are detected by referring to the wiring information. More specifically, the wiring information is searched by a name identifying a signal line in the modified information data concerning signal interconnections to detect coordinations of the ends of the signal interconnections to be corrected. Thus, specific positions on the chip are located.

With respect to an information datum indicating a kind or nature of the mending in the modified information, an area in which wiring, disconnecting or drilling can be made is determined by referring to the wiring rules. Delay can also be considered by referring to the delay value library.

The information data thus obtained about mending areas are outputted through an output device. Correctable areas may be shown by displaying them on a CRT display or by printing them with a printer. Correction of the LSI may be automatically made by sending the information data to a control means of the mending means.

In the present invention, mending-allowable areas may also be detected by using logic information data for each of the signal interconnection lines of the LSI and by referring to the wiring information, the wiring rules, etc.

The detected results may be outputted by an output device such as a printer. Thus, the mending-allowable areas mending-prohibitive areas can be known preliminarily.

Consequently, the mending of an LSI is ensured by designing the logic modification so as to avoid unmendable areas. When any logic modification is not possible within mending-allowable areas, the LSI cannot be mended so as to attain the desired logic modification. In this case, the logic designer must decide redesigning or remaking of the LSI. According to the present invention, prompt decision of the redesigning or remaking of the LSI can be made without try-and-error-basis mending operations, which can save considerable time.

It is possible to preliminarily know the possibility of mending of the LSI by obtaining the mending-allowable rate. When the LSI has a low mending-allowable rate, there is a high possibility that no mending-allowable area can be found when some logic modification is needed in future and there is little flexibility in design modification. In this case, it is better for such an LSI to start redesigning or remaking before the development progresses further.

Further according to the present invention, mending-allowable areas may be preliminarily provided in connection with interconnecting patterns of an LSI which have a possibility of being mended after production thereof. Each of the mending-allowable areas has an enlarged portion in which the spacing between adjacent interconnecting patterns is equal to or larger than the predetermined distance. Both the disconnection and interconnections to be corrected are specified, based on the wiring information data.

The wiring rule library defines conditions for allowing correction or mending on the chip. They include conditions for maintaining characteristics of the respective interconnections which are expected to have on the chip and prohibitive or allowable conditions due to technical restrictions in wiring. For example, the minimum spacing from adjacent interconnections etc. is prescribed by the wiring rule library.

The wiring of the chip is carried out to meet these conditions, and areas or positions to be corrected of the interconnections are specified so as to satisfy them. For example, positions for newly providing signal interconnections, or positions for drilling which is needed to cut interconnections or to form interconnections between different layers are determined by referring to the wiring rules.

It is preferable to prescribe in the wiring rule library conditions which are not necessary for wiring, but have a meaning only after mending of the interconnections is necessitated. For example, the conditions may include such a rule that when drilling operation is carried out for interconnection between different layers or cutting of inter-connections, no interconnecting lines should not pre sent on a layer immediately under the layer where the drilling is carried out.

In the present invention, modification information is preferably stored temporarily when the information is detected for the interconnections to be modified. For this reason, the mending-assisting system of the present invention preferably includes a mending-required interconnection information file provided in the storage means.

Information data about each signal interconnection may include a code for identifying the interconnection, and description indicative of a specific operation of mending, such as connection or disconnection of the interconnection. The interconnection-identifying code may be, for example, a name of the interconnection.

In detection of mending-allowable area or areas or in specification of positions to be corrected or mended, it is preferable to consider into a delay or a noise caused by interconnection parts left by cutting etc. With respect to the delay, a delay value library which indicates cutting positions selected according to the delay value may be provided.

Most of the mendable areas exist in regions along the line segments which constitute signal interconnections to be corrected, and detection of the mendable areas may be effected by scanning the extent of the regions or by scanning the coordinates corresponding to the grid points on the chip which are included in the regions. Thus, the detected results can be obtained in the form of a list of the coordinates of the grid points. The coordinates may be determined by referring to the wiring information file.

In the present invention, the detected mending-allowable areas may be outputted for instruction of the areas to be mended and the kinds of mending to the mending means as well as for display on the CRT display and for printing by printers. As described above, the output data may be obtained in the form of a list of coordinates indicating the mending-allowable areas. The output data may be converted into graphic information data on the basis of the coordinate list.

In the detection of the mending-allowable areas or positions, a specific position on a chip may be assigned with respect to each signal interconnection whose logic is to be modified, by selecting an appropriate position within the detected mendable area. This facilitates indication of the position to be mended to the mending means As described above, most of the mending-allowable areas exist in areas along the line segments which form signal interconnections to be mended. Therefore, it is preferable to specify locations to be mended to automatically accomplish the mending operation by means of the mending means.

The locations to be corrected may be selected freely within the mending-allowable area. For example, it may be selected in the order of the list. Or, an optimum position is selected according to a predetermined priority order within the mending-allowable area.

The selection of the optimum position is made by referring to the wiring information file, the wiring rule library and the delay value library. The priority includes that the interconnection to be mended lies on an upper layer, that the interconnection is shorter in length, or that there is no interference with another mending. Other conditions, such as delay value, may also included in the priority.

It is preferable to prescribe an order of priority according to which the conditions are applied. For example, it may have the highest priority that the interconnection to be mended is on an upper layer and this is applied first. The other conditions are also assigned with the priority orders, respectively, and they are applied in the order.

Preferably, the priorities are provided in the wiring library or in a separate priority library. The delay value library may also be provided.

According to the present invention, a mending-allowable rate may also be provided. This rate is a rate obtained by dividing the number of the signal interconnections having the detected mending-allowable areas between the pins of the circuit elements by the number of all the signal interconnections formed between the pins of the circuit elements. The mending-allowable rate may be provided by kinds or nature of the mending, for example, connecting or disconnecting operation.

The present invention further features a wiring formation or structure suited for mending of a semiconductor integrated circuit, which formation or structure is characterized in that an interconnecting pattern positioned adjacent to another interconnecting pattern has, at a portion thereof, a roundabout way which increases a spacing from said another interconnecting pattern.

The roundabout portion may be formed on the same layer as said interconnecting pattern or may be provided on a layer different from the layer where said interconnecting pattern extends and connected through through-holes. When the roundabout is provided on the different layer, it is preferably provided on an upper layer than said interconnecting pattern.

In another aspect of the invention, there is provided a wiring formation or structure suited for mending of a semiconductor integrated circuit, which includes two parallel interconnecting patterns adjacent to each other and a mending area formed, intermediate the ends of the respective interconnecting patterns, and having an enlarged spacing between said interconnecting patterns. The mending area is provided for mending of the semiconductor integrated circuit according to modification of the wiring after the circuit is formed in a chip.

A further aspect of the present invention is directed to a method for wiring interconnecting patterns of a terconnection relationships of existing circuit elements and interconnections therebetween of the LSI; a step of detecting positions on the chip of the signal interconnections to be corrected by referring to wiring information for routing the signal interconnections on the chip according to the logic information indicative of the logical interconnection relationships of the circuit elements and the signal interconnections therebetween; a step of detecting areas where the desired modification is allowed, for the signal interconnections whose positions on the chip have now been detected, by referring to a wiring rule prescribing conditions for allowing modification on the chip; and a step of outputting the results of the detection.

The present invention further features a system for mending of an LSI after it has been formed into a chip, the mending including correction of interconnections on the chip which is necessitated by modification or change of logic, which system comprises: as illustrated in FIG. 4, means for modifying logic on data to be modified of logic information indicative of logic interconnection relationships of circuit elements and signal interconnections therebetween constituting the LSI; a storage means having an original logic information master file storing original logic information before modification and a modified logic information master file for storing logic information after modification; a modification-required signal interconnection detecting means which compares the logic informations stored in the logic information master files before and after modification, respectively to detect the modification information for the signal interconnections to be corrected, based on a difference between the two information.

Figure 5:
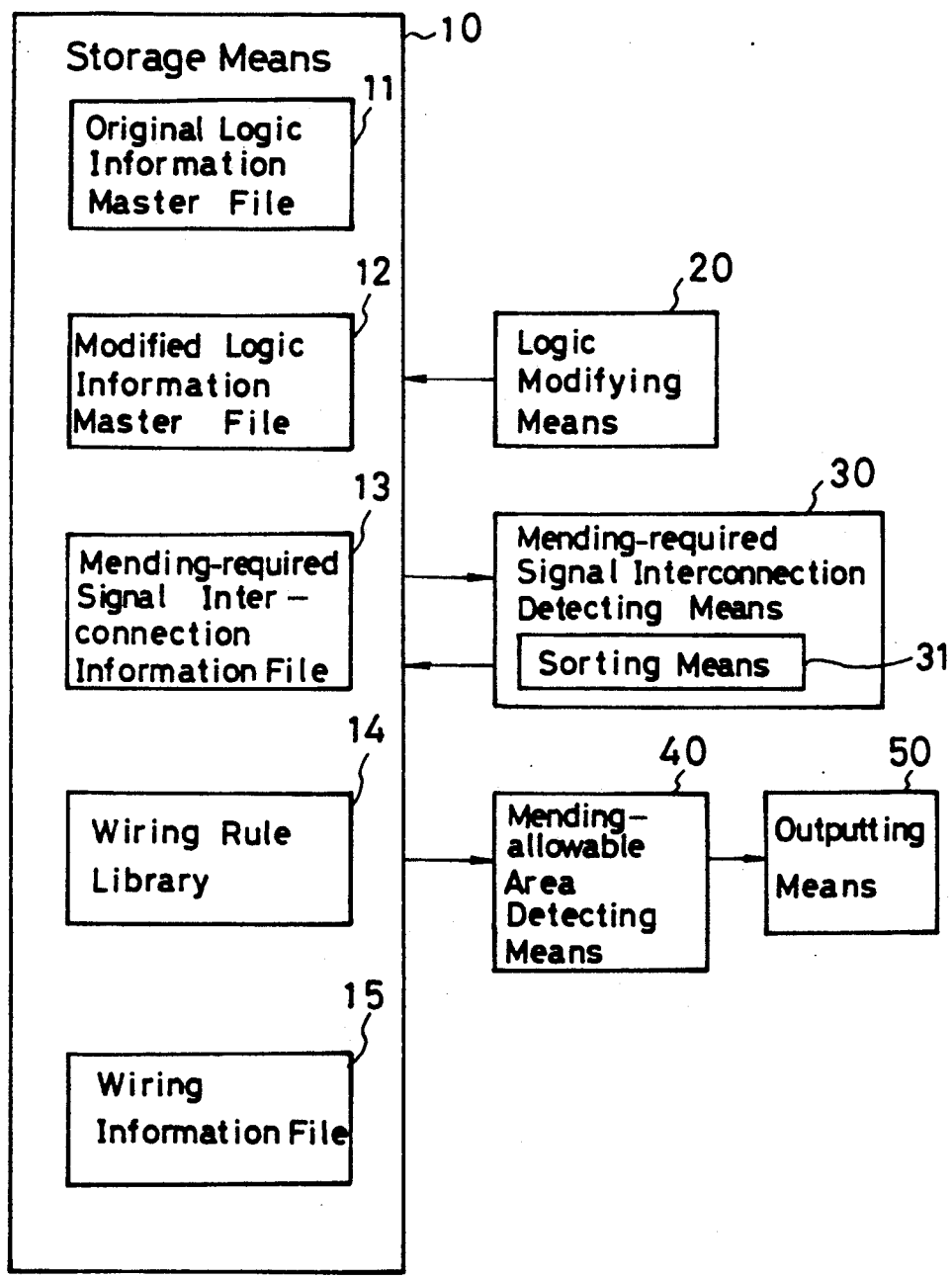

The present invention further features a system for assisting mending of an LSI, which further comprises: as illustrated in FIG. 5, a wiring information file for storing wiring information for routing the interconnections on the chip according to the logic information stored in the original logic information master file and a wiring rule library for prescribing conditions for allowing mending on the chip as wiring rules, which are provided in the storage means; a mending-allowable area detecting means for detecting a mending-allowable area areas for the signal interconnections which have now been detected as the mending-required interconnections, by referring to the wiring information and the wiring rules; and an outputting means for outputting the results of detection. The mending-required interconnection detecting means and the outputting means are additionally provided in the system of FIG. 4.

Figure 6:
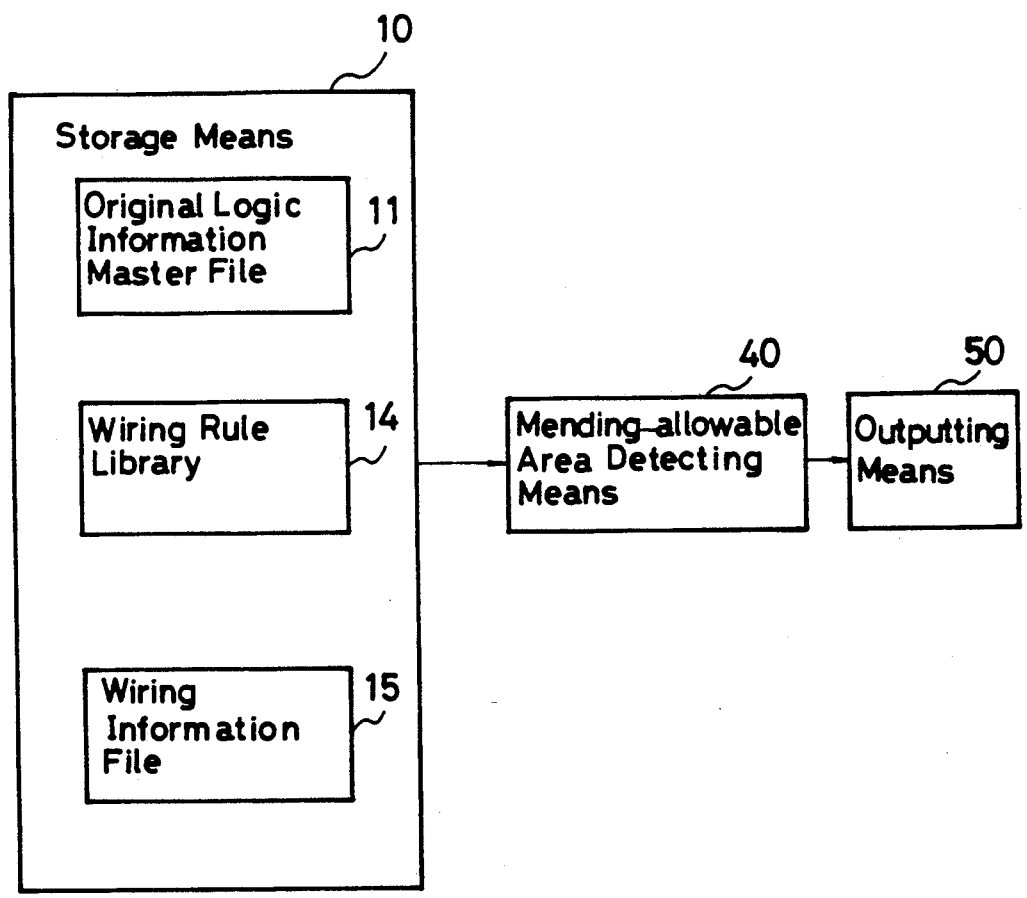

The present invention further features a system for assisting mending of an LSI after the LSI has been formed into a chip, the mending of the LSI including correction of signal interconnections on the chip so as to meet modification or change in logic, which system further comprises: as illustrated in FIG. 6, an original logic information master file storing logic information indicative of logic interconnection relationships of the circuit elements and the interconnections therebetween, a wiring information file for storing wiring information for routing the signal interconnections on the chip according to the logic information stored in the original information master file, and a wiring rule library prescribing conditions for allowing correction or mending on the chip as wiring rules, which are all stored in the storage means; a mending-allowable area detecting means for detecting a mending-allowable area or areas for the signal interconnections, based on the logic information stored in the original logic information master file, referring to the wiring information and wiring rules stored in the storage means; and an outputting means for outputting the results of the detection.

According to the present invention, the original logic information data and the logic information data which is partly modified or corrected, are compared with each other to detect a difference or differences between the two data, and the signal interconnections whose logics are to be corrected are detected in the form of a difference or differences. For the comparison operation, it is preferable to prepare an original logic information master file storing unmodified, original logic information data and a modified logic information master file, which is a copy of the original logic information master file with modified logic information data obtained by modification of the interconnections to be corrected. In this case, the logic information is sequentially read out from both the original logic information master file and the modified logic information master file for comparison.

The original logic information master file, the wiring rule library and the wiring information file may be a logic information master file prepared during the logic designing of the LSI, a wiring information file made during the layout designing thereof and a wiring rule library made also during the layout designing, respectively. However, they may be newly prepared according to necessity.

The original logic information master file may contain logic information data of different formats: a format in which signal lines connected to respective pins are indicated in relation with the respective pins or sorted by pins; or a format in which pins of the circuit elements are indicated in relation with the signal lines or sorted by the signal lines. Either of the formats may be employable in the present invention. However, the former format is preferable for making logic modification and the latter format is more convenient for indication of the mending-allowable areas or mending areas. Therefore, it is preferable that the logic information master file be described in the former format, while the modified information for the signal interconnections to be corrected be expressed in the latter format.

In such a case, the original data and the output data have different formats. To solve this problem, conversion of formats may be carried out. The conversion from the pin-base format into the signal-interconnection-base format can be effected by sorting the data by signal interconnections. For this reason, sorting means may preferably provided in the mending-required signal interconnection detecting means, or the mending-allowable area detecting means.

The wiring information file indicates routing or layout of the circuit elements and the interconnections therebetween on the chip. For example, each interconnection is divided in line segments and ends of each segment is indicated by coordinates corresponding to a grid point on the chip for indicating the interconnection between pins by combination of the line segments. In this case, the wiring information file indicates not only a two-dimensional arrangement but a three-dimensional arrangement. More specifically, the file indicates on which layer of the LSI structure is formed the segments to form the interconnection. The wiring information file may also provide information about through-holes and branch points on the chip.

Wiring of the LSI is effected according to the wiring information data, and areas or positions of the signal ing patterns on the upper and lower layers by a new interconnecting pattern 60.

Figure 13:
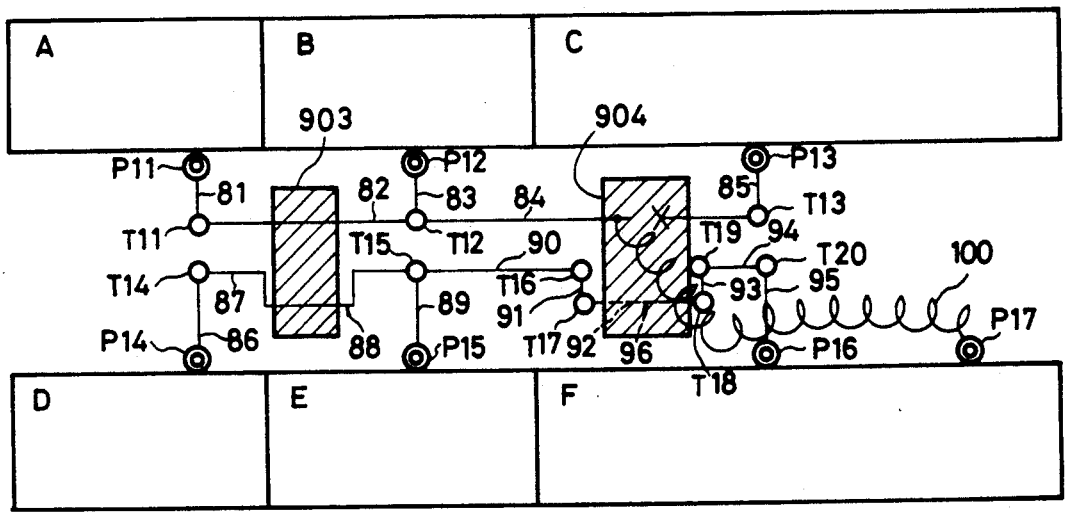
FIG. 13 is a diagrammatic illustration of the inside of an LSI to which a wiring structure and a wiring method of the present invention suited for mending of the LSI are applied.
Figure 14A:
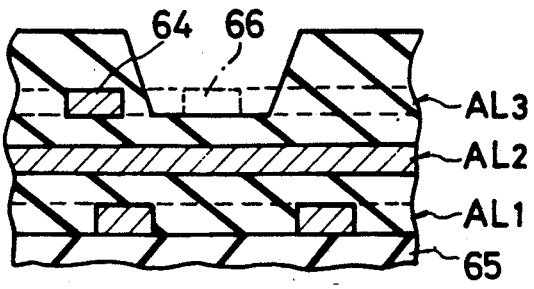
FIG. 14(a) to 14(d) are enlarged vertical sections of LSIs mended according to the present invention.
Figure 14B:
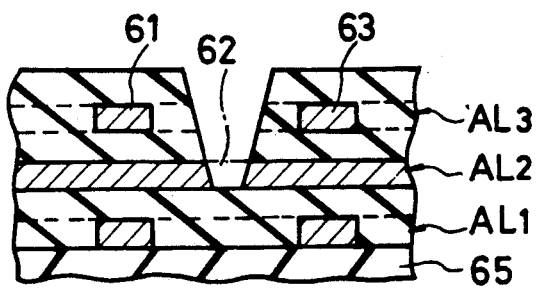
Figure 14C:
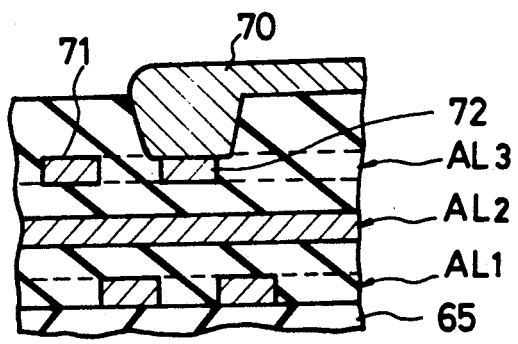
Figure 14D:
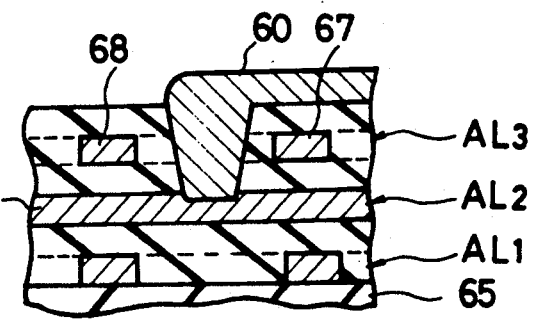

Referring now to the flow chart in FIG. 15, there will be described a method for preparing a mending area as illustrated in FIG. 13.

First, conventional automatic wiring is carried out without considering a mending area (step S0). This is done by routing interconnecting patterns on a chip according to logic information data indicating a logic interconnection relationship and formed of circuit elements and signal interconnecting patterns therebetween which constitutes the LSI. Then, all the interconnecting patterns to be subjected to mending are registered as wiring information data (step SI). The unit of the interconnecting pattern is a pin-top-in pattern, or in the case a branch point or points exists or exist, a pin-to-branch point pattern or branch point-to-branch point pattern. Interconnecting patterns to be registered may be restricted to those which have a high probability of logic modification, such as clock signal patterns. Alternatively, interconnecting patterns within a specific area in a chip may be registered. With such restriction, interconnecting patterns which have little possibility of logic modification may be free from mending. This will expedite the processing and improve both the wiring efficiency and the wiring density.

Subsequently, interconnecting patterns adjacent to each of the registered interconnecting patterns are detected and recognized (step S2). In this step, it is necessary to consider interconnecting patterns on an upper layer or layers as "the adjacent interconnecting patterns" as well as adjacent patterns on the same layer, because mending operation is made from the upper side of the LSI. It suffices to consider only an upper layer or layers as the "adjacent" patterns when it is checked whether a pattern on one layer is "adjacent " to a pattern or patterns of a different layer or layers. In order to check whether an inerconnecting pattern n a layer, for example, the lowermost layer AL1, is adjacent to an interconnecting pattern on an upper layer, for example, the uppermost layer AL3 or not, the interconnecting pattern of the layer AL3 may be projected onto the layer AL1. In this case, the relationship between these interconnecting patterns can be considered as a positional relationship on the same layer. Interconnecting patterns on an upper layer, which cross the interconnecting pattern in question, are also considered as "adjacent interconnecting pattern."

Then, it is investigated whether there is a predetermined spacing between an interconnecting pattern and any other interconnecting pattern determined as being adjacent to the same throughout its entire length (step S3). This procedure is carried out by referring to the wiring rules preliminarily prescribing conditions to allow mending on the chip, such as a spacing necessary to carry out the mending. The spacing from the adjacent interconnecting pattern is examined in measure lengths from one end of the interconnection pattern toward the other end. In this connection, it is to be noted that the adjacent interconnecting patterns include interconnecting patterns in an upper layer or layers. When an area or areas which meet the conditions required in the step S3 are found, they are registered as mending area or areas (step S5).

When no area which satisfies the conditions is present, at least one mending area is newly provided (step S4). At this time, it is preferable to select a position where no modification or change is needed for interconnecting patterns on the adjacent upper layer on which interconnections run perpendicularly. More specifically, the path or paths of the interconnections running in parallel is or are dog-legged to form a roundabout way and provide a mending area. The mending area may be provided in at least two forms, namely, the mending area 903 and 904 as shown in FIG. 13. At this time, any change in a net which has already been registered for a mending area is prohibited. The new mending area thus determined is also registered in the wiring information file (step S5).

These procedures of the steps S3 to S5 are repeated for every interconnecting pattern (step S6). After completing this processing, the interconnecting patterns of every layer and the correction areas registered are displayed, for example, on the CRT display or a graphic display device 104 or by an X-Y plotter (not shown) (step S7). The outputting mode of the registration of the mending areas is not limited to the graphical indication, but it may be an indication in the form of a list of characters, symbols or the like as far as it is recognizable. By the indication, the positions of the registered areas can be confirmed and determination as to which portion of an interconnecting pattern should be cut or should form a new interconnection can be made easier.

Figure 15:
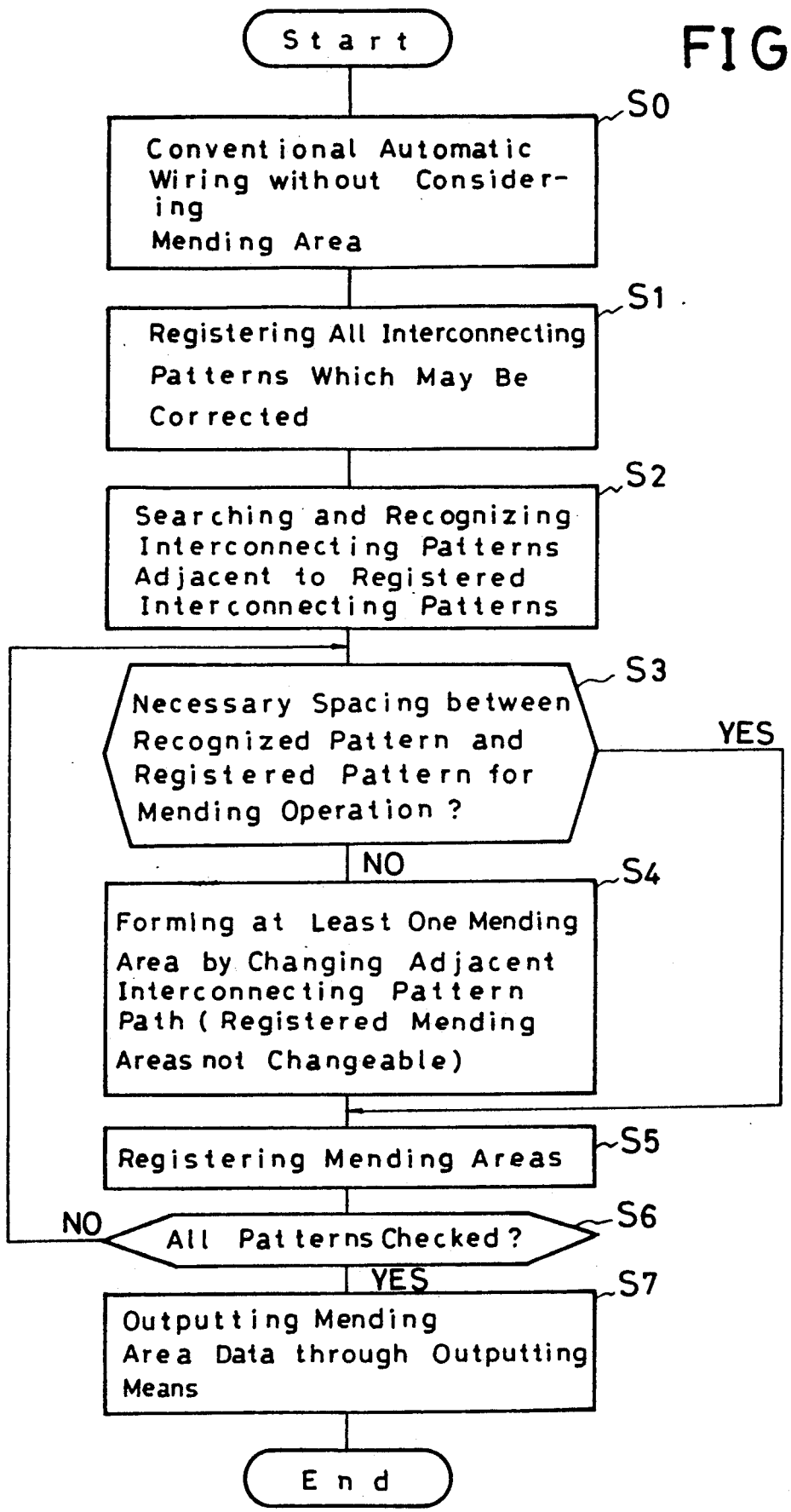
FIG. 15 is a flow chart of one embodiment of the wiring method for mending an LSI according to the present invention.
Figure 16A:
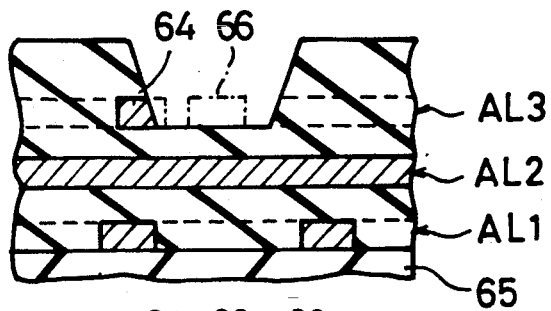
FIG. 16(a) to 16(b) illustrate enlarged vertical sections of LSIs mended according to the prior art.
Figure 16B:
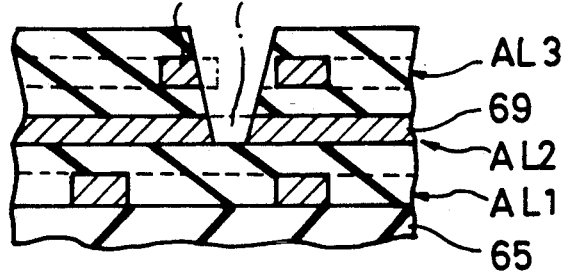
Figure 16C:
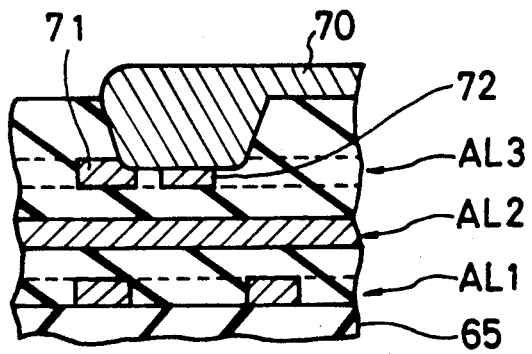
Figure 16D:
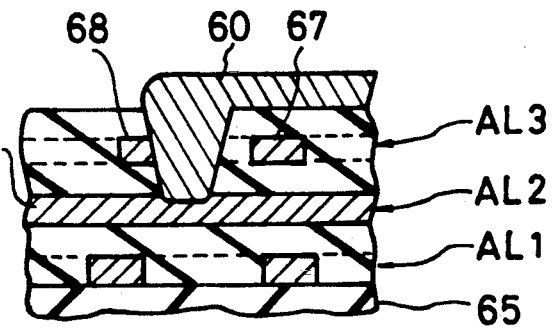

The processing of FIG. 15 may be manually carried out, but it is preferably carried out automatically with the aid of a computer program. According to the computer program, each interconnecting pattern is defined as a connection of two coordinate points, and hence calculation of the spacing from an adjacent interconnecting pattern and the change of the path of the interconnecting pattern may be carried out by calculation of coordinate values.

It would be apparent to one skilled in the art that various modifications can be made on the present invention without departing from the subject matter thereof defined in the appended claims.

What is claimed is:

1. A method for assisting mending of an LSI after it has been formed into a chip with original interconnections providing an original logic, the original interconnections being determined in accordance with an original logic information indicative of logic interconnection relationships between circuit elements and their signal interconnections of the LSI, the mending including correction of interconnections on the chip which is necessitated by modification or change from the original logic, which method comprises: a step of modifying the original logic information determining the original interconnections of the chip, so as to form modified logic information; and a step of comparing the modified logic information with the original logic information to detect modification information for interconnections of said chip to be corrected, based on differences between the modified logic information and the original logic information, and further comprising a step of detecting positions on the chip of respective signal interconnections to be corrected by referring to wiring information for the original interconnections on the chip according to the original logic information; a step of detecting areas where desired correction is allowed, for respective signal interconnections whose positions on the chip have now been detected, by referring to wiring rules prescribing conditions for allowing correction on the chip; and a step of outputting results of the step of detecting areas where desired correction is allowed.

2. A method for assisting mending of an LSI as claimed in claim 2, which further comprises a step of selecting a point within the areas where the desired correction is allowed, for each signal interconnection for which logic modification or change is required; and a step of specifying a position of the point on the chip.

3. A method for assisting mending of an LSI as claimed in claim 1, which further comprises a step of prescribing a priority order in said wiring rules for selecting an optimum point from among areas where the desired correction is allowed; a step of selecting the optimum point within the areas where the desired correction is allowed, for each signal interconnection for which logic modification or change is required, according to said priority order in said wiring rules; and a step of specifying a position of the optimum point on the chip.

4. A method for assisting mending of an LSI as claimed in claim 1, wherein the original logic information is stored in an original logic information master file, and the modified logic information is stored in a modified logic information master file, and in the step of comparing, logic information from both the original logic information master file and modified logic information master file are sequentially read out for comparison.

5. A method for assisting mending of an LSI as claimed in claim 1, wherein the step of outputting results of detecting areas where the desired correction is permitted outputs the results in a form such that automatic mending of the LSI can be achieved.

6. A method for assisting mending of an LSI after the LSI has been formed into a chip with original interconnections providing an original logic, the original interconnections being determined in accordance with an original logic information indicative of logic interconnection relationships between circuit elements and their signal interconnections of the LSI, the mending of the LSI including correction of signal interconnections on the chip which is necessitated by modification or change from the original logic, which method comprises: a step of reading sequentially logic information indicative of logical interconnection relationships between circuit elements and their signal interconnections of the LSI; a step of detecting positions, on the chip, of signal interconnections to be corrected, by referring to wiring information for routing the signal interconnections on the chip according to logic information indicative of logical interconnection relationships of the circuit elements and their signal interconnections; a step of detecting areas where a desired modification is allowed, for the signal interconnection to be corrected, by referring to wiring rules prescribing conditions for allowing modification on the chip; and a step of outputting results of the step of detecting areas where the desired modification is allowed.

7. A method for assisting mending of an LSI as claimed in claim 6, wherein each of the circuit elements of the LSI has pins, with signal interconnections between the pins, and wherein the method further includes a step of determining number of interconnections between the pins of the circuit elements, having the areas where the desired correction is allowed, and determining number of all signal interconnections between the pins of the circuit elements, and a step of dividing the former number by the latter number to obtain a mending-allowable rate.

8. A method for assisting mending of an LSI as claimed in claim 3, wherein said priority order comprises a condition that an interconnection in question lies on an upper layer, a condition that an interconnection in question is shorter in length and a condition that the optimum point does not interfere with another mending of the LSI.

9. A method for mending an LSI as claimed in claims 1, 6, 2, 3, 7 or 8, wherein said wiring rules prescribe that there should be a spacing from another adjacent interconnection, as a condition for allowing mending on the chip.

* * * * *